United States Patent
Viscarra et al.

(10) Patent No.: US 9,072,164 B2
(45) Date of Patent: Jun. 30, 2015

(54) PROCESS FOR FABRICATING A THREE DIMENSIONAL MOLDED FEED STRUCTURE

(75) Inventors: Alberto F. Viscarra, Torrance, CA (US); David T. Winslow, Culver City, CA (US); Billy D. Ables, Richardson, TX (US); Kurt S. Ketola, Los Angeles, CA (US); Kurt J. Krause, Redondo Beach, CA (US); Kevin C. Rolston, Playa Del Rey, CA (US); Rohn Sauer, Encino, CA (US); James R. Chow, San Gabriel, CA (US)

(73) Assignee: RAYTHEON COMPANY, Waltham, MA (US)

( * ) Notice: Subject to any disclaimer, the term of this patent is extended or adjusted under 35 U.S.C. 154(b) by 524 days.

(21) Appl. No.: 12/620,562

(22) Filed: Nov. 17, 2009

(65) Prior Publication Data

US 2011/0113619 A1    May 19, 2011

(51) Int. Cl.
*H01R 43/00* (2006.01)
*H05K 3/00* (2006.01)
*H01Q 21/00* (2006.01)
*H05K 1/03* (2006.01)
(Continued)

(52) U.S. Cl.
CPC ......... *H05K 3/0014* (2013.01); *Y10T 29/49156* (2013.01); *Y10T 29/49016* (2013.01); *H01Q 21/0087* (2013.01); *H05K 1/0393* (2013.01); *H05K 3/06* (2013.01); *H05K 3/388* (2013.01); *H05K 2201/0129* (2013.01); *H05K 2201/0141* (2013.01); *H05K 2203/0113* (2013.01); *H05K 2203/1105* (2013.01); *H05K 2203/302* (2013.01)

(58) Field of Classification Search
CPC .......................... H01Q 9/0421; H01Q 9/0414
USPC ........ 29/600, 601, 592.1, 830–832, 846–847;
343/700 MS, 786, 895, 873;
340/572.1–572.7
See application file for complete search history.

(56) References Cited

U.S. PATENT DOCUMENTS 3,004,229 A    10/1961    Stearns
4,853,660 A *  8/1989    Schloemann ................. 333/204
(Continued)

FOREIGN PATENT DOCUMENTS

EP    2 230 775 A2    9/2010
EP    2 288 242 A1    2/2011
(Continued)

OTHER PUBLICATIONS

Extended European Search Report for European Application No. 10251312.4, filed Jul. 23, 2010, Extended European Search Report dated Nov. 23, 2010 and mailed Dec. 10, 2010 (6 pgs.).
(Continued)

*Primary Examiner* — Minh Trinh
(74) *Attorney, Agent, or Firm* — Christie, Parker & Hale, LLP (57) ABSTRACT

A process for fabricating a three dimensional molded feed structure is provided. In one embodiment, the invention relates to a process for fabricating a three dimensional radio frequency (RF) antenna structure, the process including providing a flexible circuit substrate, forming a first preselected pattern of channels in the flexible circuit substrate, depositing a conductive layer on the formed flexible substrate, and removing portions of the conductive layer to form a plurality of conductive traces.

26 Claims, 6 Drawing Sheets

(51) Int. Cl.
*H05K 3/06* (2006.01)
*H05K 3/38* (2006.01)

(56) References Cited

U.S. PATENT DOCUMENTS

| | | | |
|---|---|---|---|
| 5,097,101 A * | 3/1992 | Trobough | 174/254 |
| 5,262,590 A | 11/1993 | Lia | |
| 5,408,240 A | 4/1995 | Battista et al. | |
| 5,526,565 A * | 6/1996 | Roberts | 29/884 |
| 5,633,615 A | 5/1997 | Quan | |
| 6,018,326 A | 1/2000 | Rudisill | |
| 6,061,245 A | 5/2000 | Ingraham et al. | |
| 6,366,185 B1 | 4/2002 | Keesey et al. | |
| 6,444,921 B1 | 9/2002 | Wang et al. | |
| 6,696,163 B2 * | 2/2004 | Yang | 428/458 |
| 6,871,396 B2 * | 3/2005 | Sugaya et al. | 29/860 |
| 6,992,629 B2 | 1/2006 | Kerner et al. | |
| 7,298,331 B2 | 11/2007 | Oberly | |
| 7,523,548 B2 * | 4/2009 | Kataoka et al. | 29/846 |
| 7,525,498 B2 | 4/2009 | Quan et al. | |
| 7,645,941 B2 | 1/2010 | Wesselman et al. | |
| 7,992,293 B2 * | 8/2011 | Carmi | 29/832 |
| 8,043,464 B2 | 10/2011 | Kim et al. | |
| 8,453,314 B2 * | 6/2013 | Viscarra et al. | 29/600 |
| 2005/0264448 A1 | 12/2005 | Cox et al. | |
| 2006/0097945 A1 | 5/2006 | McCarville et al. | |
| 2007/0025044 A1 | 2/2007 | Golubovic et al. | |
| 2007/0131451 A1 | 6/2007 | Schmachtenberg, III et al. | |
| 2007/0139275 A1 | 6/2007 | Deaett et al. | |
| 2008/0088519 A1 * | 4/2008 | Quan et al. | 343/770 |
| 2009/0165296 A1 | 7/2009 | Carmi | |
| 2009/0231226 A1 | 9/2009 | Quan et al. | |
| 2011/0113618 A1 | 5/2011 | Viscarra et al. | |
| 2011/0113619 A1 | 5/2011 | Viscarra et al. | |
| 2011/0114242 A1 * | 5/2011 | Kim et al. | 156/49 |
| 2011/0115578 A1 | 5/2011 | Quan et al. | |

FOREIGN PATENT DOCUMENTS

| | | |
|---|---|---|
| FR | 2 871 336 A1 | 2/2005 |
| GB | 2 064 233 A | 6/1981 |
| JP | 8 051 279 A | 2/1996 |
| JP | 9 281520 A | 10/1997 |
| JP | 2001-135899 A | 5/2001 |
| JP | 2001-189609 A | 7/2001 |
| JP | 2003-347503 A | 12/2003 |
| JP | 2007-221077 A | 8/2007 |
| WO | WO 2008/045349 A1 | 4/2008 |

OTHER PUBLICATIONS

Extended European Search Report for European Application No. 10251577.2, filed Sep. 10, 2010, Extended European Search Report dated Feb. 24, 2011 and mailed Mar. 4, 2011 (5 pgs.).

Extended European Search Report for European Application No. 10251576.4, filed Sep. 10, 2010, Extended European Search Report dated Feb. 24, 2011 and mailed Mar. 4, 2011 (6 pgs.).

Office Action mailed Jun. 8, 2011 for U.S. Appl. No. 12/620,544, filed Nov. 17, 2009, Inventor Alberto F. Viscarra, et al. (14 pgs.).

Extended search report for European Application No. 10251575.6-1248, Raytheon Company, European extended search report dated Jun. 8, 2011 and mailed Jun. 16, 2011 (8 pgs.).

First Office Action mailed May 29, 2012 in Japan Patent Application No. 2010-171363, filed Jul. 30, 2010 (3 pages).

English translation of First Office Action mailed May 29, 2012 in Japan Patent Application No. 2010-171363, filed Jul. 30, 2010 (4 pages).

Office action mailed May 9, 2012 for U.S. Appl. No. 12/534,077, filed Jul. 31, 2009, Inventor Clifton Quan, et al. (21 pgs.).

* cited by examiner

PROCESS FOR FABRICATING A THREE DIMENSIONAL MOLDED FEED STRUCTURE

STATEMENT REGARDING FEDERALLY SPONSORED RESEARCH

This invention disclosure is related to Government contract number FA8750-06-C-0048 awarded by the U.S. Air Force. The U.S. Government has certain rights in this invention.

BACKGROUND

The present invention relates generally to a process for fabricating a three dimensional molded feed structure. More specifically, the invention relates to a process for fabricating a three dimensional radio frequency (RF) antenna structure using lightweight materials.

Next generation large area multifunction active arrays for applications such as space and airborne based antennas need to be lighter weight, lower cost and more conformal than what can be achieved with current active array architecture and multilayer active panel array development. These space and airborne antennas can be used for radar and communication systems, including platforms such as micro-satellites and stratospheric airships.

To address the need for lower cost and lightweight antennas, lightweight materials can be used to form antenna component structures. However, such lightweight materials can present new challenges for precisely forming antenna structures capable of providing sufficient performance in radar and communication systems.

SUMMARY OF THE INVENTION

Aspects of the invention relate to a process for fabricating a three dimensional molded feed structure. In one embodiment, the invention relates to a process for fabricating a three dimensional radio frequency (RF) antenna structure, the process including providing a flexible circuit substrate, forming a first preselected pattern of three dimensional channels in the flexible circuit substrate, depositing a conductive layer on the formed flexible substrate, and removing portions of the conductive layer to form a plurality of conductive traces.

DETAILED DESCRIPTION OF THE INVENTION

Thin flex circuit technologies can be used to build a thin ultra lightweight structural conformal antenna that can meet and surpass the challenging weight requirements for airship and space platforms. Applying three dimensional (3-D) circuitry on a folded/formed RF flex layer is a key enabler to bringing integrations of both electrical and mechanical functions to new heights. This can result in up to a 75% reduction in weight and in the number of dielectric, conductor, and adhesive layers. These methods integrate the microwave transmission line and components, control signal, and DC power manifold into multilayer 3-D fluted flex circuit board assemblies that are lighter weight and more rigid than can be done with conventional technology. This is accomplished with unique and innovative folding of alternating flex layers to effectively increase the area to route the RF, signal, and power lines onto a single layer without increasing the PCB panel area and minimizing the number of vias and traces within the RF flex circuitry. In addition, specialized imaging onto three dimensional surfaces can allow for implementation of 3-D circuitry on the formed antenna structures.

To form the lightweight antenna, both a level one (L1) RF feed and a level two (L2) RF feed can be used. Each RF feed can include a formed or folded flexible circuit layer and a flat flexible circuit layer. Each of the folded layers can be formed using innovative processes. Once the components or layers of the L1 and L2 RF feeds have been formed, then a process for assembling the RF feeds and ultimately the entire antenna structure can be performed.

Referring now to the drawings, embodiments of processes for fabricating a three dimensional molded feed structures such as a level two feed are illustrated. In some embodiments, the processes provide a flexible circuit substrate such as a liquid crystal polymer (LCP) substrate and form a preselected pattern of channels in the substrate, where such channels can be components of structures suitable to generating and receiving RF signals. In such case, the processes can also deposit a conductive layer onto the formed flexible substrates and then remove portions of the conductive layer to form a number of conductive traces. In this way, three dimensional formed flexible substrates can have surfaces having conductive traces, thereby providing both structural support for an antenna feed and surface areas for routing of electrical signals.

In several embodiments, the removal of portions of the conductive layer includes applying a resist layer, exposing and developing the resist layer, etching the conductive layer in accordance with the resist layer, and removing the resist layer. The exposing and developing of the resist layer can implemented using a contact printing process, a conductive photoresist process or another suitable process.

In several embodiments, the flexible circuit substrates for the L1 and L2 feeds are made of a lightweight material such as the LCP material. In a number of embodiments, the flexible substrates have copper or aluminum cladding on one or both surfaces of the substrate and copper or aluminum circuitry etched on those surfaces. In other embodiments, the flexible substrates have no initial cladding and conductive layers are added to 3-D formed surfaces of the flexible substrates.

In many embodiments, other related processes are performed to fabricate the L1 feeds, to assemble and electrically interconnect the L1 and L2 feeds, and to route signals along transmission lines disposed on the feeds.

The level one (L1) RF feed for the RF antenna structure can be fabricated using specialized processes for shaping flexible circuit substrates. The fabrication process is described in a co-pending U.S. patent application, entitled "Process for Fabricating An Origami Formed Antenna Radiating Structure", U.S. Pat. No. 8,127,432, the entire content of which is expressly incorporated herein by reference.

The level two (L2) RF assembly for the RF antenna structure can be fabricated using the processes described herein. Processes for assembling the level one and level two feeds are described in co-pending U.S. patent application, entitled "Systems and Methods for Assembling Lightweight RF Antenna Structures", U.S. Pat. No. 8,043,464, the entire content of which is expressly incorporated herein by reference.

In order to deliver RF signals to active elements of a radiating long slot aperture of an L1 feed, an RF matched interconnect can be made between the radiating slot structure and the L2 RF feed. In the case of a lightweight antenna, the interconnect is preferably electrically sound as well as structurally sound. A process for electrically and physically interconnecting L1 and L2 feeds is described in co-pending U.S. patent application, entitled "Multi-Layer Microwave Corrugated Printed Circuit Board and Method", U.S. patent application Ser. No. 12/534,077, now abandoned, the entire content of which is expressly incorporated herein by reference.

As these next generation lightweight antennas are designed from flexible substrates, new challenges for the transmission lines used on those substrates are presented. The transmission lines provide pathways for RF signals used in conjunction with the antennas. There are several types of transmission lines and each type of RF transmission line has advantages based on the structure of the antenna/substrate at a given point. As the structure of the L1 and L2 feeds varies at different locations on the antenna, a transition from one type of transmission line to another can be very useful. An RF transition for an RF structure such as an L2 feed is described in co-pending U.S. patent application, entitled "RF Transition With 3-Dimensional Molded RF Structure", U.S. Pat. No. 8,362,856, the entire content of which is expressly incorporated herein by reference.

Figure 1:
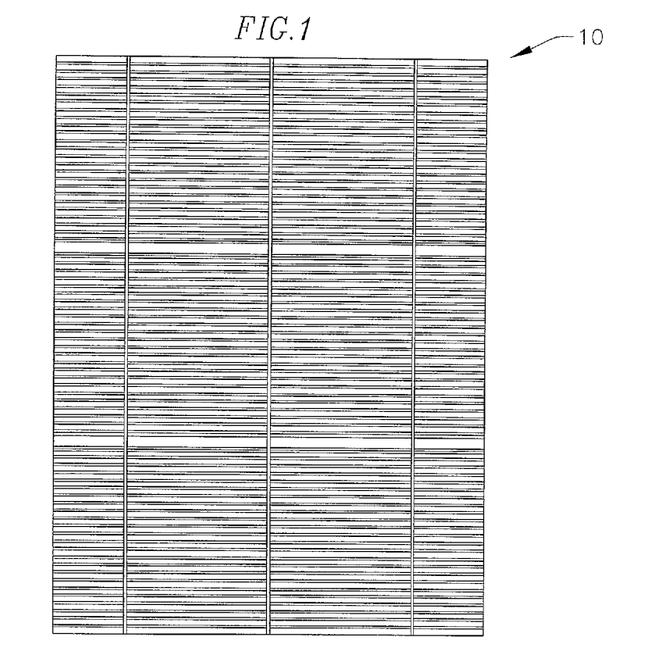
FIG. 1 is a top view of an RF antenna structure constructed of lightweight materials in accordance with one embodiment of the invention.

FIG. 1 is a top view of an RF antenna structure 10 constructed of lightweight materials in accordance with one embodiment of the invention. The RF antenna structure can act as or be a component of an antenna used in an active array radar system. In other embodiments, it may be used in other radar or communication systems.

Figure 2:
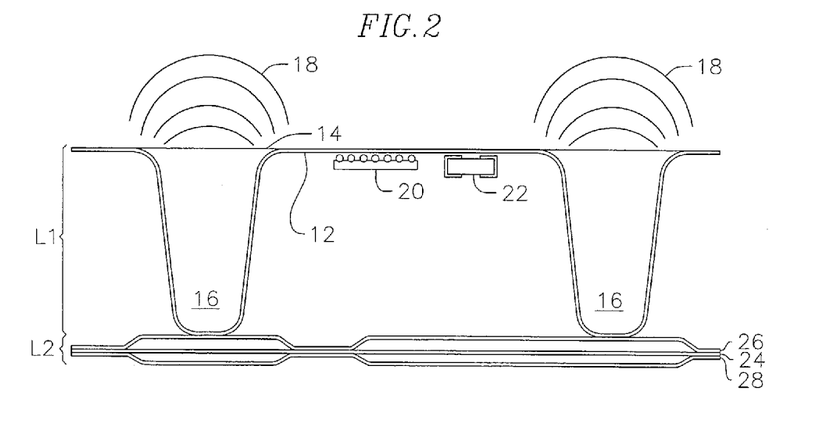
FIG. 2 is a cross sectional view of a portion of the RF antenna structure of FIG. 1 illustrating a level one RF feed assembly mounted to a level two RF feed assembly in accordance with one embodiment of the invention.

FIG. 2 is a cross sectional view of a portion of the RF antenna structure of FIG. 1 illustrating a level one (L1) RF feed assembly bonded to a level two (L2) RF feed assembly in accordance with one embodiment of the invention. The L1 assembly includes a folded flexible circuit layer 12 and a flat flexible circuit layer 14 where the folded areas of flexible layer 12 form elongated channels, or long slot radiators, 16 that radiate RF signals 18. Electrical components such as transmit/receive (T/R) chips 20 and capacitors 22 are mounted to a surface of the folded flex circuit layer 12. In a number of embodiments, the flexible circuit layers are formed of an LCP material.

The L2 feed "sandwich" assembly is mounted below the L1 feed assembly. The L2 feed assembly consists of three layers of LCP; a flat center layer 24, and molded/formed top 26 and bottom covers 28. The RF signals in the structure can support a suspended air-stripline transmission line design. In such case, the RE signals can travel within a cavity made by the top cover 26 and the bottom cover 28. The center layer 24 can provide RF signal trace routing for the transmission line. The top and bottom covers are plated on the inside of the cavity, providing the RF ground for the airline. As the topology of the 3-D antenna assembly varies across the assembly, use of different types of transmission lines on different sections of the assembly can maximize antenna performance. Therefore, transitions from one type of transmission line to another are useful for the three dimensional antenna structure. A description of an RE transition that can be used in conjunction with the L2 feed assembly is described in a co-pending U.S. patent application, entitled, "RF Transition with 3-Dimensional Molded Structure", as referenced above, U.S. Pat. No. 8,362,856, the entire content of which is expressly incorporated herein by reference.

On the outside of the top and bottom covers of the L2 assembly, digital control signals and power distribution lines can be routed. The traces and plating on the layers can be copper. However, in order to meet more strict weight requirements, the plating can also be replaced with aluminum. Similar traces and plating materials can be used for the L1 feed assembly.

The L1 feed assembly is bonded to the L2 feed assembly, and together they form the RF antenna array structure. In one embodiment, the L1 feed is approximately 7.8 mm tall, the L2 feed is approximately 1.4 mm tall, and therefore the entire assembly is approximately 9.2 mm tall (not including support electronics placed on the L2 assembly or any mounting standoffs). Each array panel of the RF antenna can be approximately 0.945 m by 1.289 m, or an area of 1.218 $m^2$. In several embodiments, each panel is electrically and mechanically independent from other panels. In other embodiments, the feeds and panels can have other suitable dimensions.

Support electronics for an active array antenna, such as the beam steering computer (BSC) and the power control modules (PCMs) can be attached to the back side of the L2 feed assembly. Communication in and out of the panels can be provided by fiber optic cables. The fiber cables enable communication with electronics located off of the antenna structure, and the opto-electronics mounted on the backside of the Level 2 feed.

Figure 3:
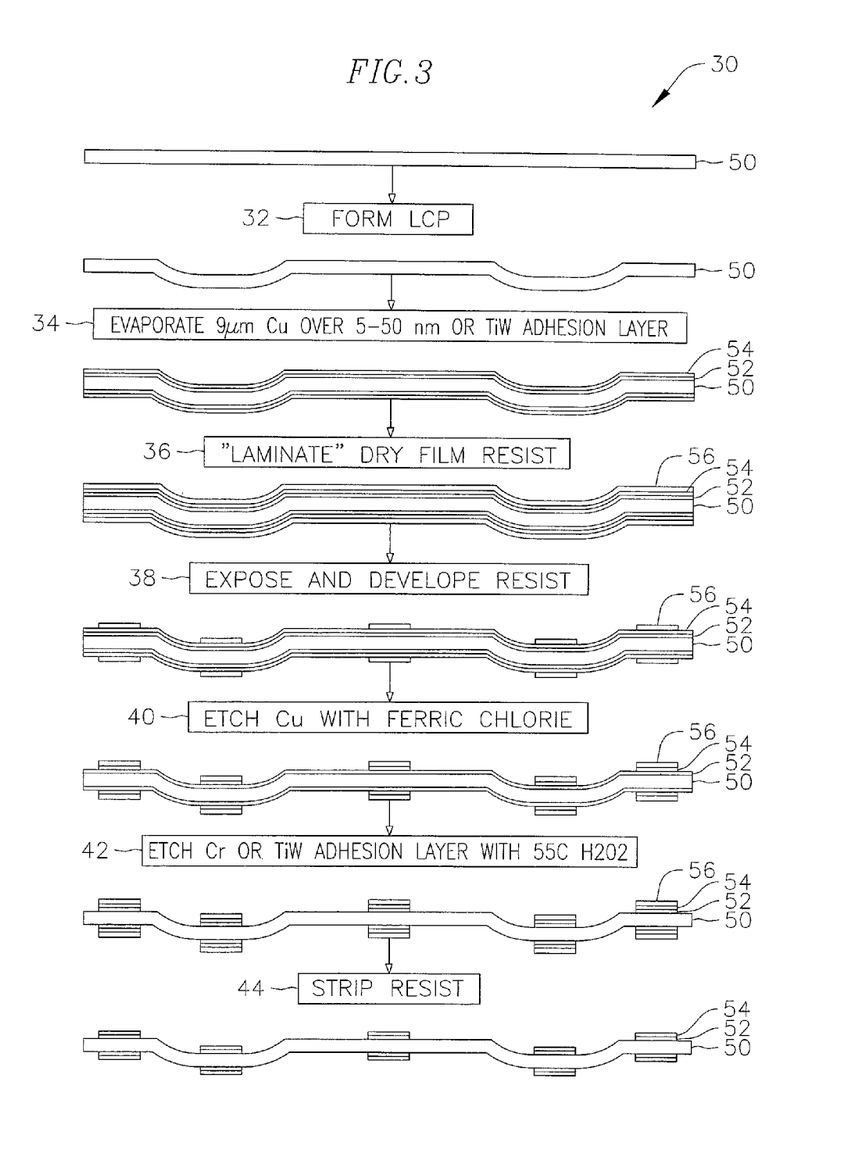
FIG. 3 is a process flow diagram illustrating a process for fabricating a formed component of a level two RF feed assembly using a flexible circuit substrate and a conductive copper layer in accordance with one embodiment of the invention.

FIG. 3 is a process flow diagram illustrating a process 30 for fabricating a formed component of a level two RF feed assembly using a flexible circuit substrate and a conductive copper layer in accordance with one embodiment of the invention. The process 30 can begin by forming (32) a preselected three dimensional pattern in a flat flexible LCP substrate 50. In a number of embodiments, the LCP substrate is placed on a precision die (not shown) having a preselected pattern of channels disposed in the die. The preselected pattern can be chosen based on desired RF performance characteristics and/or a particular antenna application. A silicone backer plate (not shown) can be placed on the LCP substrate such that the LCP substrate is sandwiched between the silicone backer plate and the precision die. Pressure and heat can be applied by the backer plate on the flexible substrate to force the flexible substrate to take the shape of the channels of the precision die. The backer plate can have a pattern of protrusions shaped such that the backer plate mates with the precision die. In several embodiments, the backer plate, LCP substrate and precision die are securely clamped or otherwise sandwiched together and then heated at a preselected temperature for a preselected duration. In such case, the LCP substrate is precisely formed. In several embodiments, the LCP substrate is unclad or free of any conductive metal at this stage. In one embodiment, the LCP substrate is approximately 4 mils thick.

Once the LCP substrate is formed, the process can evaporate (34) materials to form an adhesion layer 52 and then a copper layer 54 onto the top and bottom surfaces of the formed LCP substrate 50. In some embodiments, no adhesion layer is used. In the embodiment illustrated in FIG. 3, the adhesion layer 52 evaporated includes 5 to 50 nanometers (nm) of Chromium (Cr) or Titanium-Tungsten (TiW). In other embodiments, other suitable materials can be used for the adhesion layer. In the embodiment illustrated in FIG. 3, the copper layer 54 evaporated includes 9 micrometers (um) of copper. In another embodiments, the copper layer 54 includes 6 um of copper. In other embodiments, other suitable amounts of copper or other suitable conductors can be used. In other embodiments, the deposition of the adhesion layer and copper layer can be accomplished using sputtering, vapor deposition or another means of depositing the materials onto the formed LCP substrate.

After the adhesion layer 52 and the copper layer 54 have been deposited onto the formed flexible substrate 50, the process can apply or laminate (36) a dry film resist layer 56 onto the conductive layer 54 on the formed flexible substrate 50. In other embodiments, other techniques can be used for adding the layer of resist. In one embodiment, for example, a spin coating process can be used to apply the resist layer.

Once the resist layer 56 has been added, the process can expose and develop (38) the resist with a preselected resist pattern. In such case, the surface areas still having the resist after the exposure and development will generally be protected from subsequent etching processes. In several embodiments, such resist areas can represent the areas which will generally form conductive traces at the conclusion of the process. In one embodiment, the resist is exposed using an optical imaging system.

The process can then etch (40) the exposed copper layer 54 with ferric chloride or another solution capable of etching copper in accordance with the preselected resist pattern. In the embodiment illustrated in FIG. 3, the adhesion layer 52 remains below the etched copper layer 54 at this point. In such case, the process then etches (42) the adhesion layer 54 with a solution of hydrogen peroxide ($H_2O_2$) at 55 degrees Celcius or another suitable solution. In such case, the adhesion layer 52 is substantially removed from the areas of the LCP substrate 50 that no longer have the resist disposed thereon. Once the adhesion layer 52 has been etched, the process can remove or strip (44) the resist 56 from the LCP substrate 50. In such case, a three dimensional LCP substrate having conductive traces is formed, which can be used to form a level two RF feed for a lightweight antenna system. In one embodiment, the conductive traces are approximately 6 microns thick. In a number of embodiments, two formed, or three dimensional, LCP substrates can be combined with a single flat LCP substrate to form a level two feed (see e.g. FIG. 2). Processes for assembling the level two feeds are described in co-pending U.S. patent application, entitled "Systems and Methods for Assembling Lightweight RF Antenna Structures", U.S. Pat. No. 8,043,464, the entire content of which is expressly incorporated herein by reference.

In the embodiment illustrated in FIG. 3, the process uses a conductive photoresist subprocess to image and then etch the resist layer on the three dimensional formed LCP substrate. In other embodiments, the process can use a contact printing subprocess to image and etch the resist layer on the three dimensional formed LCP substrate. In the embodiment illustrated in FIG. 3, the process uses a copper conductive layer 54. In other embodiments, other suitable metals can be used for the conductive layer, including, for example, aluminum.

Figure 4:
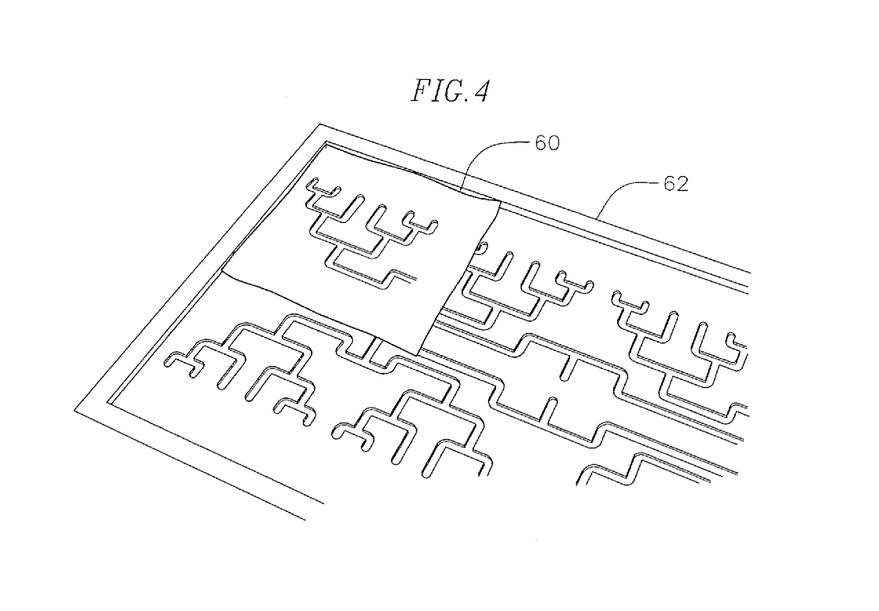
FIG. 4 is a perspective view of a section of a flexible circuit substrate being formed in conjunction with a precision die in accordance with one embodiment of the invention.

FIG. 4 is a perspective view of a section of flexible LCP substrate 60 being formed in conjunction with a precision die 62 in accordance with one embodiment of the invention. In some embodiments, a preselected channel pattern is formed in the LCP substrate using the precision die and silicone backer plate. In several embodiments, the LCP substrate 60 and precision die 62 can be used with the process of FIG. 3.

Figure 5:
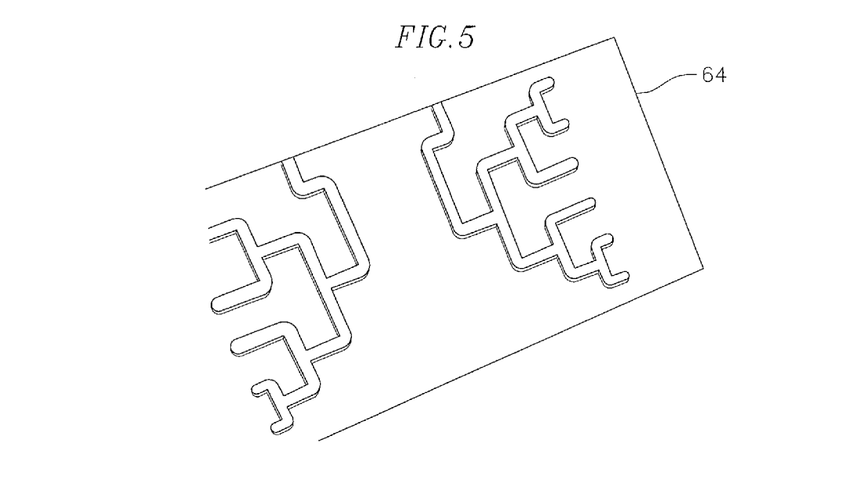
FIG. 5 is a perspective view of a silicone backer plate that can be used in conjunction with the precision die of FIG. 4 to form the flexible substrate.

FIG. 5 is a perspective view of a silicone backer plate 64 that can be used in conjunction with the precision die 62 of FIG. 4 to form the preselected pattern in flexible LCP substrate 60.

Figures 6, 7, 8:
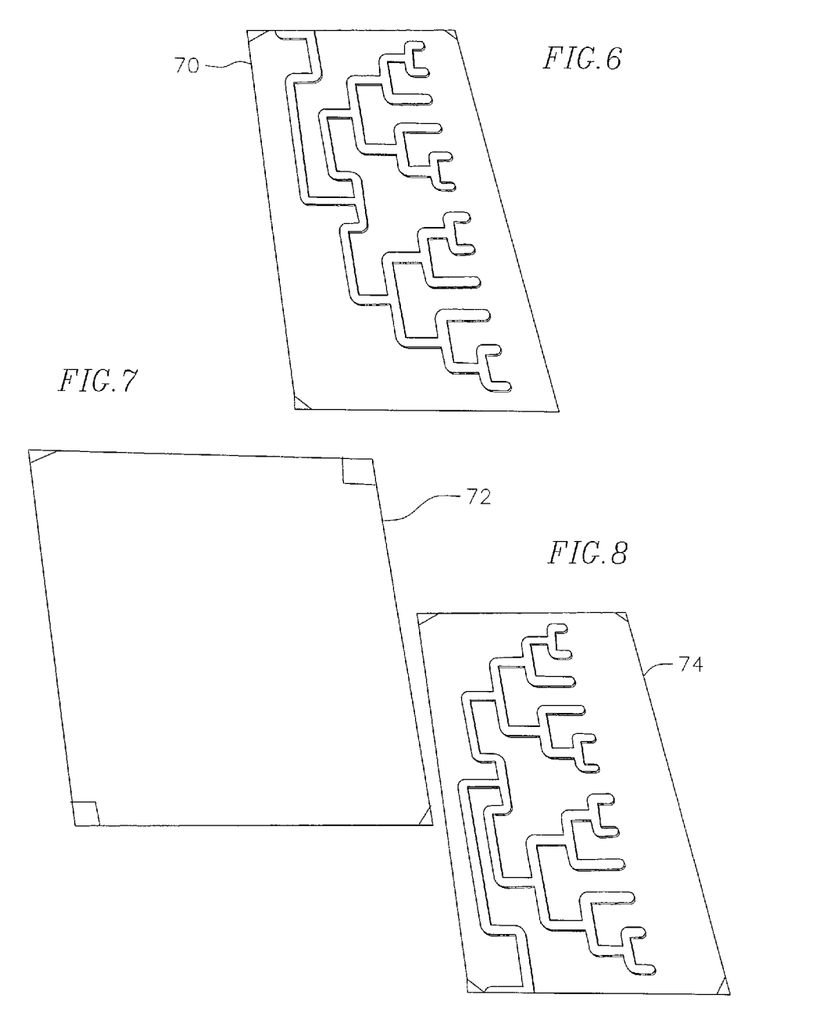
FIG. 6 is a perspective view of a formed flexible substrate after a conductive metal layer has been deposited on the surface of the formed flexible substrate in accordance with one embodiment of the invention.
FIG. 7 is a perspective view of a flat flexible substrate after a conductive metal layer has been added to the surface of the flat flexible substrate in accordance with one embodiment of the invention.
FIG. 8 is a perspective view of a second formed flexible substrate after a conductive metal layer has been added to the surface of the second formed flexible substrate in accordance with one embodiment of the invention.

FIG. 6 is a perspective view of a formed flexible substrate 70 after a conductive metal layer has been deposited on the surface of the formed flexible substrate in accordance with one embodiment of the invention.

FIG. 7 is a perspective view of a flat flexible LCP substrate 72 after a conductive metal layer has been added to the surface of the flat flexible substrate in accordance with one embodiment of the invention.

FIG. 8 is a perspective view of a second formed flexible substrate 74 after a conductive metal layer has been deposited on the surface of the second formed flexible substrate in accordance with one embodiment of the invention.

Figure 9:
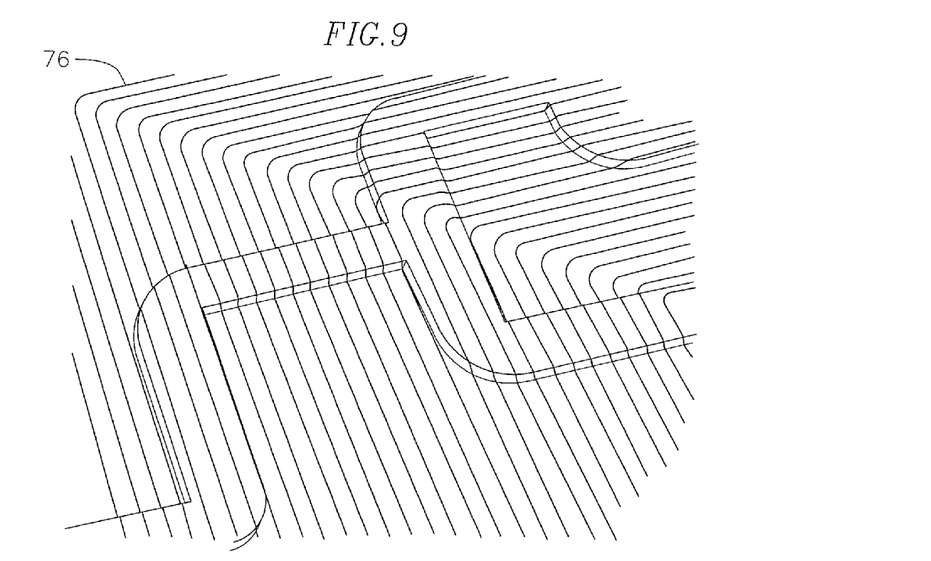
FIG. 9 is a perspective view of a section of a formed flexible substrate that has been imaged in accordance with one embodiment of the invention.

FIG. 9 is a perspective view of a section of a formed flexible substrate 76 that has been imaged in accordance with one embodiment of the invention.

Figure 10:
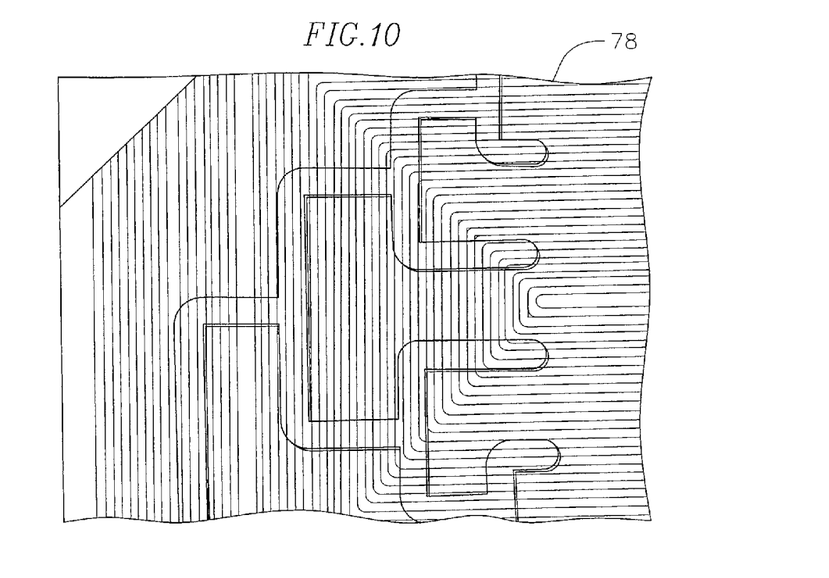
FIG. 10 is a top view of a section of a formed flexible substrate that has been imaged in accordance with one embodiment of the invention.

FIG. 10 is a top view of a section of a formed flexible substrate 78 that has been imaged in accordance with one embodiment of the invention.

Figure 11:
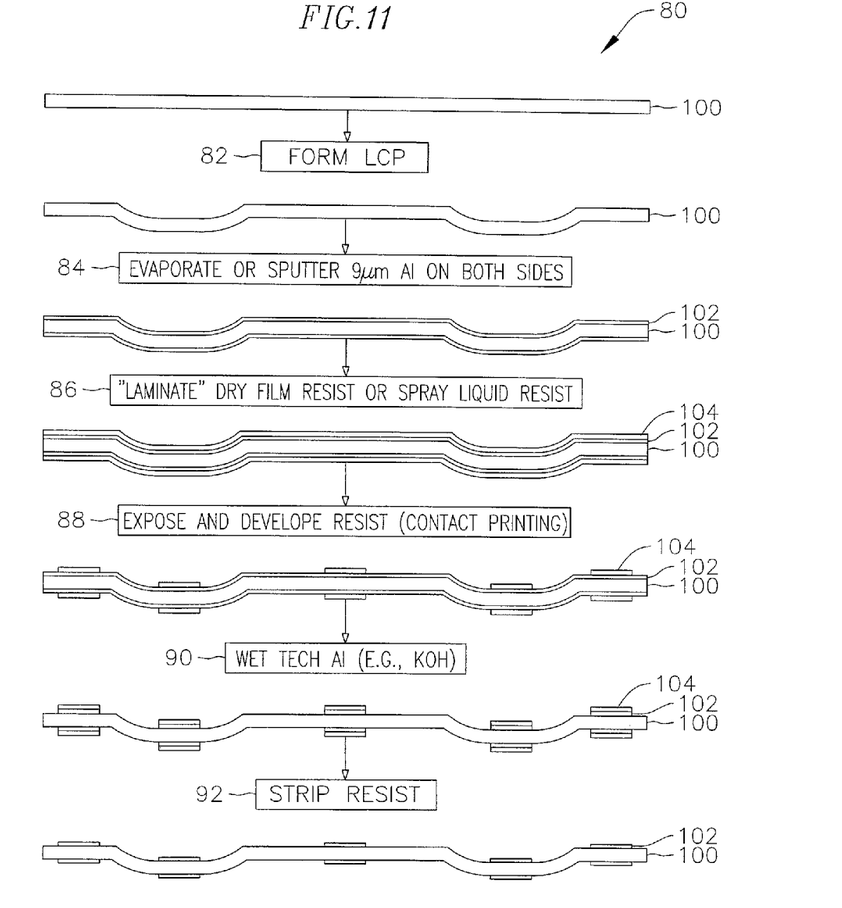
FIG. 11 is a process flow diagram illustrating a method for fabricating a formed component of a level two RF feed assembly using a flexible substrate and a conductive aluminum layer in accordance with one embodiment of the invention.

FIG. 11 is a process flow diagram illustrating a process 80 for fabricating a formed component of a level two RF feed assembly using a flexible substrate and a conductive aluminum layer in accordance with one embodiment of the invention. The process 80 can begin by forming (82) a preselected three dimensional pattern in a flat LCP substrate 100. In a number of embodiments, the LCP substrate 100 is placed on a precision die (not shown) having a preselected pattern of channels disposed in the die. In such case, a silicone backer plate (not shown) is placed on the LCP substrate such that the LCP substrate is sandwiched between the silicone backer plate and the precision die. Pressure can be applied by the backer plate on the flexible substrate to force the flexible substrate to take the shape of the channels of the precision die. The backer plate can have a pattern of protrusions shaped such that the backer plate mates with the precision die. In several embodiments, the backer plate, the LCP substrate and the precision die are securely clamped or otherwise sandwiched together and then heated at a preselected temperature for a preselected duration.

Once the LCP substrate 100 is formed, the process can evaporate or sputter (84) materials to form an aluminum layer 102 on the top and bottom surfaces of the formed LCP substrate 100. In some embodiments, an adhesion layer can be added prior to the aluminum layer. In the embodiment illustrated in FIG. 11, the aluminum layer 102 includes 9 um of aluminum. In another embodiment, the aluminum layer 102 includes 6 um of aluminum. In some embodiments, other suitable amounts of aluminum or other suitable conductors can be used. In other embodiments, the deposition of the aluminum layer can be accomplished using another means of depositing the materials onto the formed LCP substrate.

After the aluminum layer 102 has been deposited onto the formed flexible substrate 100, the process can apply or laminate (86) a dry film resist layer 104 onto the conductive aluminum layer 102 on the formed flexible substrate 100. In other embodiments, other techniques can be used for adding the layer of resist. In one embodiment, for example, a spin coating process can be used to apply the resist layer. In another embodiment, a spraying process can be used to apply the resist layer.

Once the resist layer 104 has been added, the process can expose and develop (88) the resist with a preselected resist pattern. In such case, the surface areas still having the resist after the exposure and development will generally be protected from subsequent etching processes. In several embodiments, such resist areas can represent the areas which will generally form conductive traces at the conclusion of the process. In a number of embodiments, the exposing and developing can be accomplished using a contact printing method. Contact printing can be less expensive and easier to manufacture than other methods for depositing a resist layer. In one embodiments, the resist is exposed using an optical system.

The process can then wet etch (90) the exposed aluminum layer 102 with potassium hydroxide (KOH) or another solution capable of etching aluminum in accordance with the preselected resist pattern. Once the aluminum layer 102 has been etched, the process can remove or strip (92) the resist 104 from the LCP substrate 100. In such case, a three dimensional LCP substrate having conductive traces is formed, which can be used to form a level two RF feed for a lightweight antenna system. In a number of embodiments, two formed, or three dimensional, LCP substrates can be combined with a single flat LCP substrate to form a level two feed (see e.g. FIG. 2). Processes for assembling the level two feeds are described in co-pending U.S. patent application, entitled "Systems and Methods for Assembling Lightweight RF Antenna Structures", U.S. Pat. No. 8,043,464, the entire content of which is expressly incorporated herein by reference.

In the embodiment illustrated in FIG. 11, the process uses a contact printing subprocess to image and etch the resist layer onto the three dimensional formed LCP substrate. In other embodiments, the process can use a conductive photoresist subprocess to image and etch the resist layer onto the three dimensional formed LCP substrate. In the embodiment illustrated in FIG. 11, the process uses a conductive aluminum layer. In other embodiments, other suitable metals can be used for the conductive layer.

While the above description contains many specific embodiments of the invention, these should not be construed as limitations on the scope of the invention, but rather as examples of specific embodiments thereof. Accordingly, the scope of the invention should be determined not by the embodiments illustrated, but by the appended claims and their equivalents.

What is claimed is:

1. A process for fabricating a three dimensional radio frequency (RF) antenna structure, the process comprising:
   providing a foldable flexible circuit substrate;
   forming a first preselected pattern of channels in the flexible circuit substrate;
   depositing a conductive layer on the formed flexible substrate having the first preselected pattern of channels after forming the first preselected pattern of channels in the flexible circuit substrate; and
   removing portions of the conductive layer to form a plurality of conductive traces.

2. The process of claim 1, wherein the removing portions of the conductive layer to form the plurality of conductive traces comprises:
   applying a resist layer to the conductive layer;
   exposing and developing the resist layer;
   etching the conductive layer; and
   removing the resist layer.

3. The process of claim 2:
   wherein the applying the resist layer to the conductive layer comprises applying a resist layer having a second preselected pattern to the conductive layer; and
   wherein the etching the conductive layer comprises etching the conductive layer in according with the second preselected pattern.

4. The process of claim 2, wherein the exposing and developing the resist layer is performed using a conductive photoresist process.

5. The process of claim 2, wherein the exposing and developing the resist layer is performed using a contact printing process.

6. The process of claim 1, wherein the flexible substrate comprises a liquid crystal polymer (LCP) material.

7. The process of claim 1, wherein the conductive layer comprises copper.

8. The process of claim 1, wherein the conductive layer comprises aluminum.

9. The process of claim 1, wherein the depositing the conductive layer on the formed flexible substrate comprises evaporating a conductive material on the formed substrate.

10. The process of claim 1, wherein the depositing the conductive layer on the formed flexible substrate comprises sputtering a conductive material on the formed substrate.

11. The process of claim 1, wherein the depositing the conductive layer on the formed flexible substrate comprises:
    depositing a first conductive layer on a top surface of the formed substrate; and
    depositing a second conductive layer on a bottom surface of the formed substrate.

12. The process of claim 11, further comprising:
    applying a first resist layer to the top surface of the formed substrate; and
    applying a second resist layer to the bottom surface of the formed substrate.

13. The process of claim 12, further comprising:
    etching the first conductive layer; and
    etching the second conductive layer.

14. The process of claim 1, wherein the depositing the conductive layer on the formed flexible substrate comprises depositing an adhesion layer on the formed flexible substrate, and depositing the conductive layer on the adhesion layer.

15. The process of claim 14, wherein the adhesion layer is comprised of a material selected from the group consisting of Chromium and Titanium-Tungsten.

16. The process of claim 14, further comprising etching the adhesion layer.

17. The process of claim 1 further comprising, mounting at least one electronic component to the formed flexible substrate.

18. The process of claim 17, wherein the at least on one electronic component comprises transmit/receive circuitry.

19. The process of claim 1, wherein the first preselected pattern of channels comprises a pattern of concave shaped channels.

20. The process of claim 1, wherein at least one of the plurality of conductive traces extends across a channel of the first preselected pattern of channels.

21. The process of claim 1, wherein each of the channels is configured to radiate RF signals.

22. A process for fabricating a three dimensional radio frequency (RF) antenna structure, the process comprising:
- providing a flexible circuit substrate;
- forming a first preselected pattern of channels in the flexible circuit substrate;
- depositing a conductive layer on the formed flexible substrate; and
- removing portions of the conductive layer to form a plurality of conductive traces,
- wherein the forming the first preselected pattern of channels in the flexible circuit substrate comprises:
  - placing the flexible substrate on a precision die comprising the first preselected pattern of channels;
  - pressing the flexible substrate into the precision die using an elastomeric material thereby sandwiching the flexible substrate between the elastomeric material and the precision die; and
  - applying heat to the flexible substrate sandwiched between the elastomeric material and the precision die.

23. The process of claim 22, wherein the elastomeric material comprises silicone in the form of a backer plate shaped to precisely mate with the die.

24. A process for fabricating a three dimensional radio frequency (RF) antenna structure, the process comprising:
- providing a flexible circuit substrate;
- placing the flexible substrate on a precision die comprising a first preselected pattern of channels;
- pressing the flexible substrate into the precision die using an elastomeric material thereby sandwiching the flexible substrate between the elastomeric material and the precision die to form the first preselected pattern of channels in the flexible substrate;
- depositing a conductive layer on the formed flexible substrate having the first preselected pattern of channels after forming the first preselected pattern of channels in the flexible circuit substrate; and
- removing portions of the conductive layer to form a plurality of conductive traces.

25. The process of claim 24, wherein the flexible circuit substrate is configured to be folded.

26. The process of claim 24, wherein each of the channels is configured to radiate RF signals.

* * * * *